United States Patent [19]

Bhaskar et al.

[11] Patent Number: 4,847,630
[45] Date of Patent: Jul. 11, 1989

[54] INTEGRATED THERMAL INK JET PRINTHEAD AND METHOD OF MANUFACTURE

[75] Inventors: Eldurkar V. Bhaskar; Marzio A. Leban, both of Corvallis, Oreg.

[73] Assignee: Hewlett-Packard Company, Palo Alto, Calif.

[21] Appl. No.: 134,135

[22] Filed: Dec. 17, 1987

[51] Int. Cl.[4] ............................................. G01D 9/00
[52] U.S. Cl. ................................. 346/1.1; 346/140 R
[58] Field of Search ...................... 346/1.1, 140 PD

[56] References Cited

U.S. PATENT DOCUMENTS

| | | | |
|---|---|---|---|
| 4,513,298 | 4/1985 | Scheu | 346/140 PD |
| 4,528,577 | 7/1985 | Cloutier et al. | 346/140 PD |
| 4,535,343 | 8/1985 | Wright et al. | 346/140 PD |
| 4,578,687 | 3/1986 | Cloutier et al. | 346/140 PD |
| 4,680,859 | 7/1987 | Johnson | 346/140 PD |
| 4,694,308 | 9/1987 | Chan et al. | 346/140 PD |
| 4,716,423 | 12/1987 | Chan et al. | 346/140 PD |
| 4,746,935 | 5/1988 | Allen | 346/140 PD |

Primary Examiner—E. A. Goldberg
Assistant Examiner—Huan H. Tran
Attorney, Agent, or Firm—William J. Bethurum

[57] ABSTRACT

We describe an integrated thermal ink jet printhead and manufacturing process therefor which includes the successive build-up of an orifice plate, a first barrier layer, heater resistors, a second barrier layer, and an ink reservoir-defining layer on top of a reusable or "dummy" substrate. Lead-in conductors are formed integral with the heater resistors by controlling the cross-sectional areas of these components, and openings (passageways) are formed between ink reservoirs and the orifice plate to provide for ink flow under control of the heater resistors. The dummy substrate is stripped away from the adjacent orifice plate, and the ink reservoir defining layer may be secured to an ink supply tank which supplies ink to the individual ink reservoirs. Thus, the orifice plate, heater resistors and ink flow paths of the printhead are self aligned, and the heater resistors are removed from direct cavitational forces from ink ejected from the orifice plate.

19 Claims, 6 Drawing Sheets

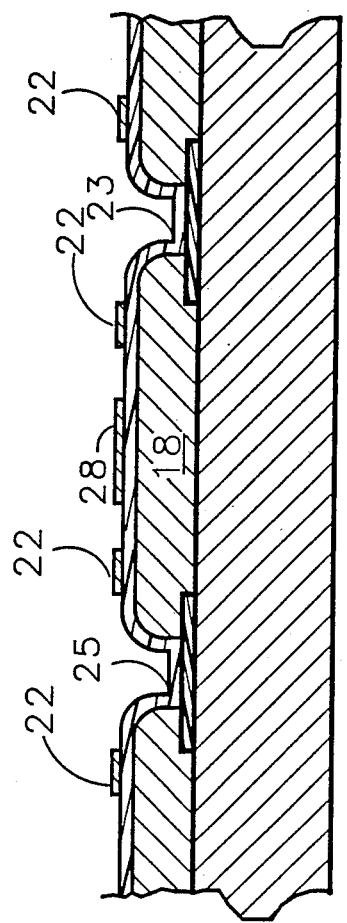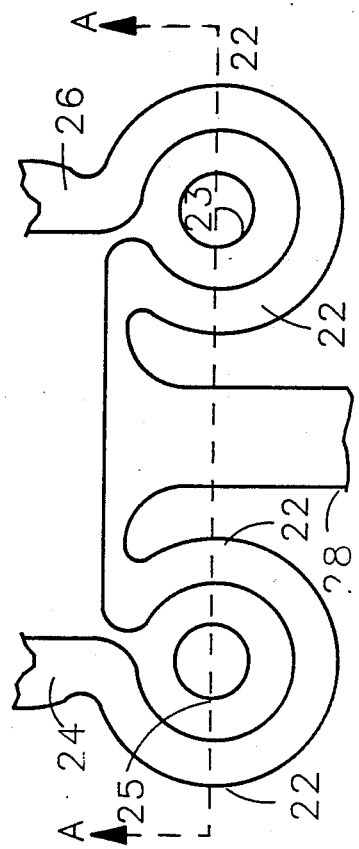

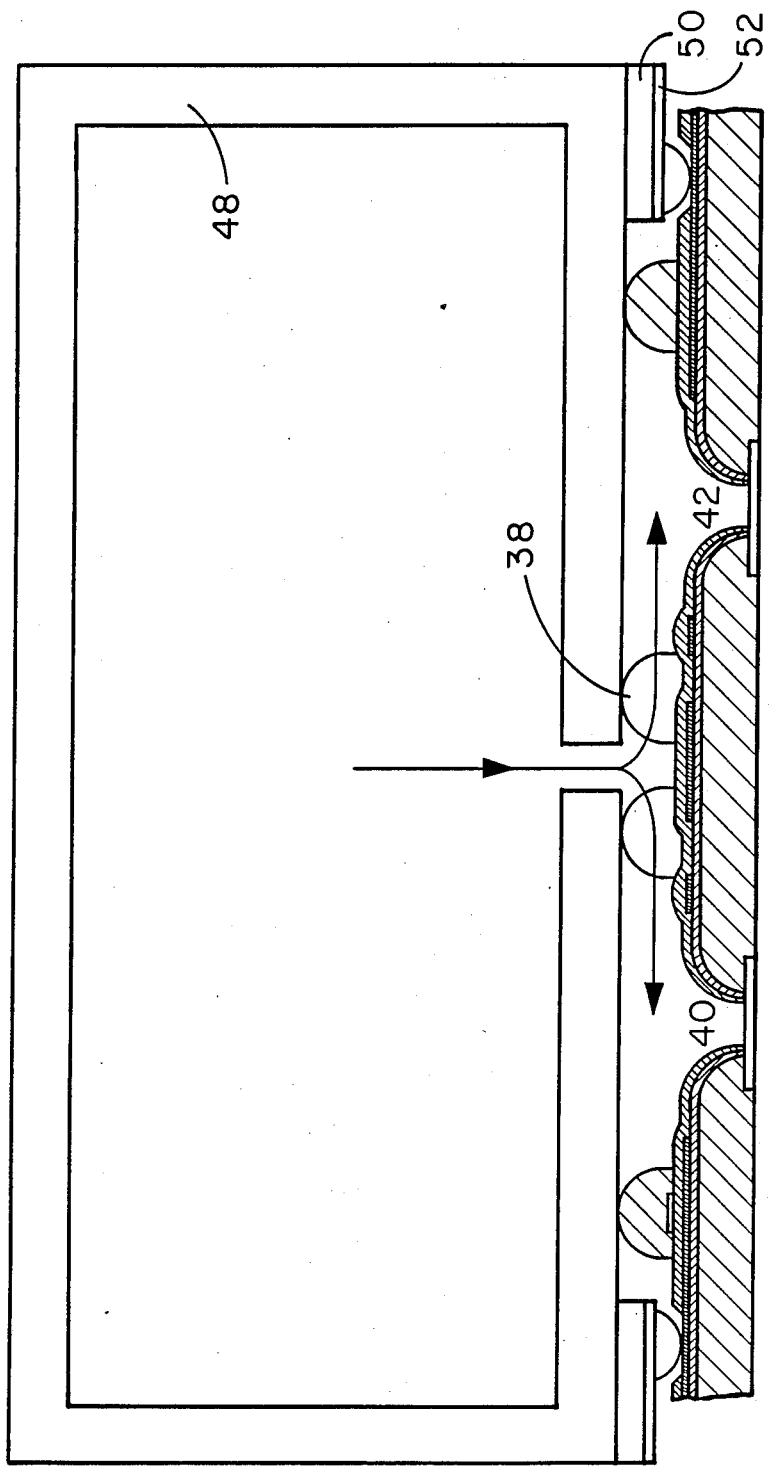

INTEGRATED THERMAL INK JET PRINTHEAD AND METHOD OF MANUFACTURE

TECHNICAL FIELD

This invention relates generally to thermal ink jet (TIJ) printing and more particularly to a new and improved integrated thermal ink jet printhead and novel method of manufacturing same.

BACKGROUND ART

In the field of thermal ink jet printing, many present manufacturing processes use a chosen thin film processing technique to make the thin film resistor (TFR) substrate portion of the printhead and a separate orifice plate manufacturing technique to make the metal orifice plate having a desired number and geometry of ink ejection orifices therein. Then, using critical alignment techniques, the orifice plate is precisely aligned with the thin film resistor substrate in such a manner that the heater resistors of the TFR substrate are precisely aligned with the orifices in the orifice plate. Thus, the heater resistors are positioned to heat the ink in associated ink reservoirs which are usually aligned with both the heater resistors and the orifices in the orifice plate. In this fashion, the ink is heated to boiling and forced out of the orifices during a thermal ink jet printing operation. One such fabrication process of the type described above is disclosed in the *Hewlett-Packard Journal*, Vol. 38, Number 5, May 1985, incorporated herein by reference.

While the above Hewlett-Packard process has proven highly successful in most respects, it nevertheless does require the critical alignment between the orifice plate and the thin film resistor substrate, and it further requires separate processing to form the orifice plate and to form the thin film resistor substrate which are subsequently aligned.

DISCLOSURE OF INVENTION

It is an object of the present invention to provide a new and improved thermal ink jet printhead and process for manufacturing same wherein the above orifice plate processing and thin film resistor substrate processing have been combined into a single novel process sequence This invention provides a relatively inexpensive and reliable manufacturing process for the large scale production of thermal ink jet printheads, and additionally overcomes the above critical alignment problem of the prior art.

Another object of this invention is to provide a new and improved integrated thermal, ink jet printhead and associated manufacturing process wherein the ink jet printhead thus produced has a longer lifetime relative to currently available printheads.

A feature of this invention is the provision of an improved self-aligning process for building up the orifice plate and heater resistors in sequence on a dummy substrate. This process has been greatly simplified relative to currently available printhead orifice plate alignment processes.

Another feature of this invention is the provision of an alignment process which has a very precise alignment of three (3) critical parts of the ink jet printhead, and thus results in an improved performance of such printhead.

The above objects, features and advantages of this invention are accomplished herein by initially providing a reusable or dummy substrate and forming an orifice plate thereon using chosen electroforming techniques. Next, a first insulating barrier layer is formed on the orifice plate, and then heater resistors are selectively spaced on the first barrier layer in a predefined configuration. A second insulating barrier layer is then deposited on the first barrier layer and extends over the heater resistors to protect these resistors from ink corrosion and cavitation wear. Then, an ink reservoir-defining layer is formed on the second barrier layer and has a plurality of ink reservoir openings therein which are aligned with openings in the orifice plate. Finally, the dummy substrate is mechanically separated from the orifice plate to unplug the openings in the orifice plate, and the ink reservoir-defining layer can now be secured to an ink supply chamber or pen body housing or the like.

The present invention is also directed to a printhead structure made by the above manufacturing process.

The above summary of invention and various objects, features and advantages thereof will become more readily apparent and understood from the following description of the accompanying drawings

BRIEF DESCRIPTION OF THE DRAWINGS

FIGS. 1–10 herein illustrate, in a sequence of schematic cross-section views, the preferred process and structural embodiments of this invention.

FIG. 1 is a cross-section view of a reusable substrate upon which photoresist islands have been deposited.

FIG. 2 is a cross-section view illustrating the electrodeposition of an orifice plate onto the upper surface of the structure in FIG. 1.

FIG. 2 is a cross-section view illustrating the deposition of a first insulating coating on the upper surface of the orifice plate shown in FIG. 2.

FIGS. 4A and 4B illustrate in cross-section and plan views, respectively, the formation of the partially circular or C-shaped heater resistors together with the integral lead-in conductors for applying drive current thereto.

FIG. 6 is a cross-section view illustrating the deposition of a conductive seed material on the upper surface of the second insulating protective layer previously formed.

FIG. 7 illustrates the electrodeposition of the ink reservoir walls symmetrically atop the previously formed seed material in FIG. 6.

FIG. 8 is a cross-section view illustrating the removal of the reusable substrate previously described, taking therewith the photoresist islands and leaving the aligned orifice openings in the orifice plate.

FIG. 10 is a cross-section view which illustrates one exemplary arrangement for mounting the self-aligned printhead of FIGS. 9A and 9B with a much larger unitary reservoir member.

DESCRIPTION OF THE PREFERRED EMBODIMENT

Figure 1:
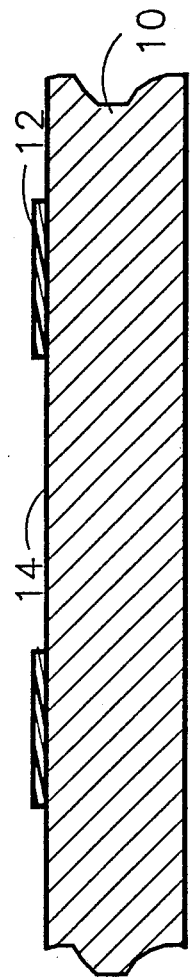
Figure 2:
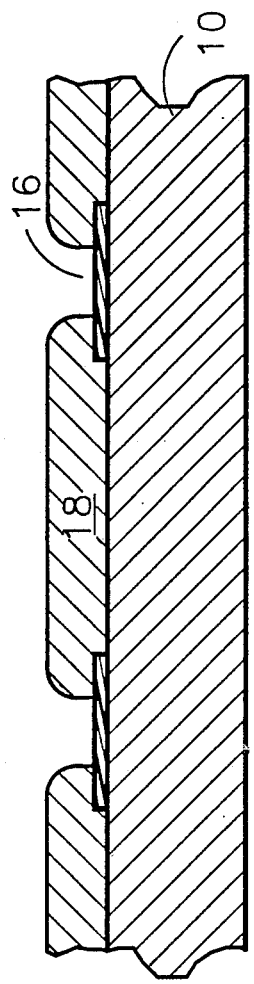

Referring now to FIG. 1, the substrate starting material 10 may be either silicon or glass and will typically be 200-300 microns in thickness. A photoresist pattern 12 is formed in the geometry shown on the upper surface 14 of the substrate 10, and the photoresist mask 12 serves to define openings 16 in a subsequently deposited nickel pattern 18 which is electroformed on the exposed upper surface 14 in the geometry shown in FIG. 2. This process of electroforming nickel on either silicon or glass is generally well known in the art of manufacturing orifice plates for thermal ink jet printheads and is disclosed, for example, in both the *Hewlett-Packard Journal* cited above and in U.S. Pat. No. 4,694,308 issued to Chor S. Chan et al entitled "Barrier Layer and Orifice Plate for Thermal Ink Jet Print Head Assembly", incorporated herein by reference.

Figure 3:
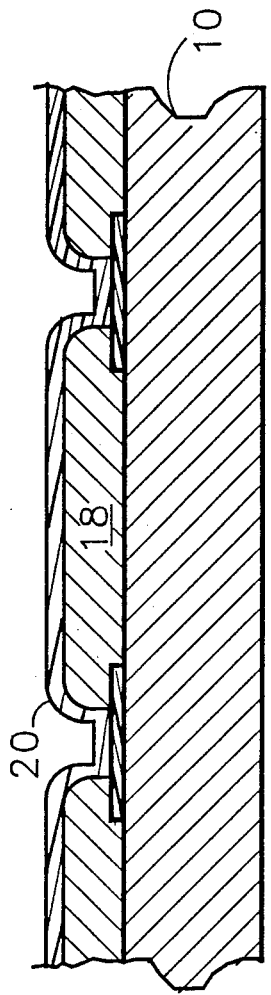

Referring now to FIG. 3, a first barrier layer 20 of an insulating film such as silicon nitride or silicon oxynitride or silicon dioxide is deposited on top of the nickel layer 18. Then a thin film resistor/conductor material 22 and 28 respectively which will perform both resistor and conductor functions of a heater resistor and a conductor when properly treated is deposited by sputtering on the upper surface of the insulating layer 20. The resistor portion is indicated as 22 and the conductor portion is indicated as 24, 26 and 28 in FIGS. 4A and 4B. This thin film resistor/conductor layer is patterned using conventional photoresist masking and etching processes. The thin pattern of resistive heater material 22 is formed in the circular geometry of FIGS. 4A and 4B and is integrally formed with lead-in conductors 24, 26 and 28 in the geometry shown in FIG. 4B.

The circular strip 22 will be the heater resistor by virtue of the fact that it has more number of squares in a given area. That is, the resistance R of both heater resistor 22 and conductor material 24 is equal to Rs L/A, where Rs=sheet resistivity of material, L=length of material, and A =cross section area of material That is: R=Rs L/A. Therefore, by the appropriate selection of the width and length of openings in the mask used to define the resistor portion (22) and conductor portion (24,26,28) of the integral resistor/-conductor strip atop the insulating layer 20 in FIG. 4A, the resistance of these segments of the resistor/conductor strip can be controlled as is known in the art.

Figure 5A:
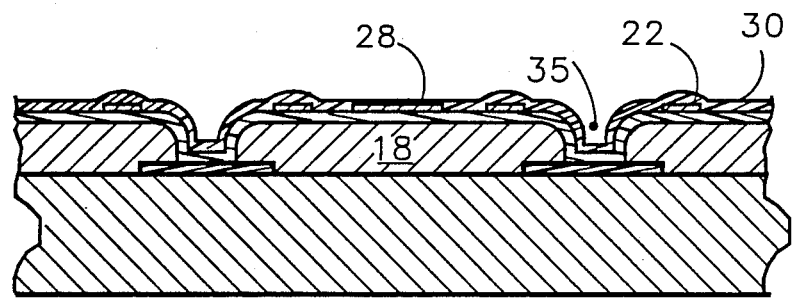
FIGS. 5A and 5B illustrate in cross-section and plan views, respectively, the formation of a second protective insulating layer for covering the heater resistors, and FIG. 5B further illustrates the topographical geometry of the lead-in conductors.
Figure 5B:
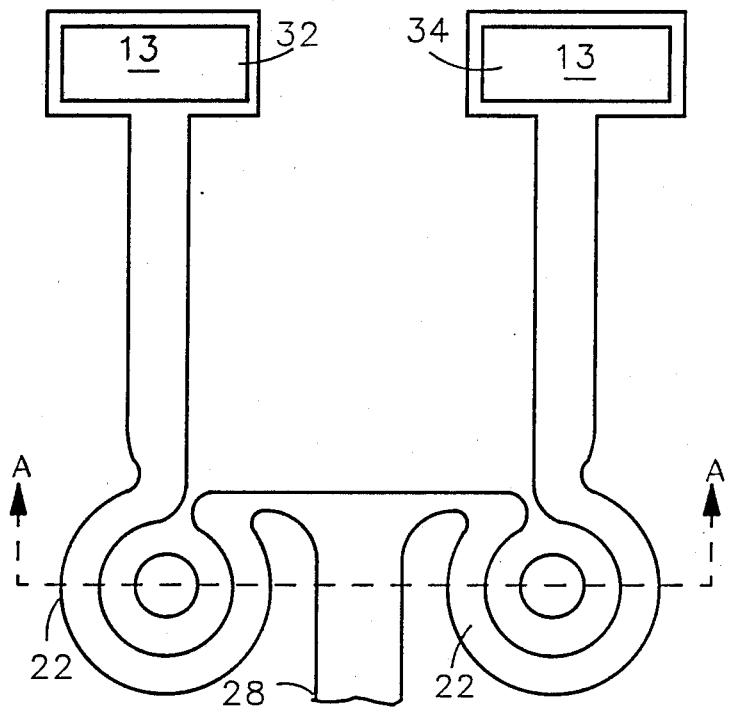

Referring now to FIGS. 5A and 5B, a second barrier layer 30 is formed atop the resistor and conductor strips of FIG. 4B, and this second barrier layer 30 is preferably a combination of silicon nitride and silicon carbide. The silicon nitride is initially deposited on the surface of FIG. 4A and is followed by a subsequent deposition of silicon carbide so as to provide a highly inert composite $Si_3N_4$/SiC second barrier layer 30. This barrier layer 30 protects the underlying material against ink corrosion and cavitation wear during an ink jet printing operation. The second barrier layer 30 is then selectively etched in the contact areas 32 and 34 of FIG. 5B in order to enable electrical connections to be made to the underlying conductive trace material 24 and 26 for driving the heater resistors 22.

Figure 6:
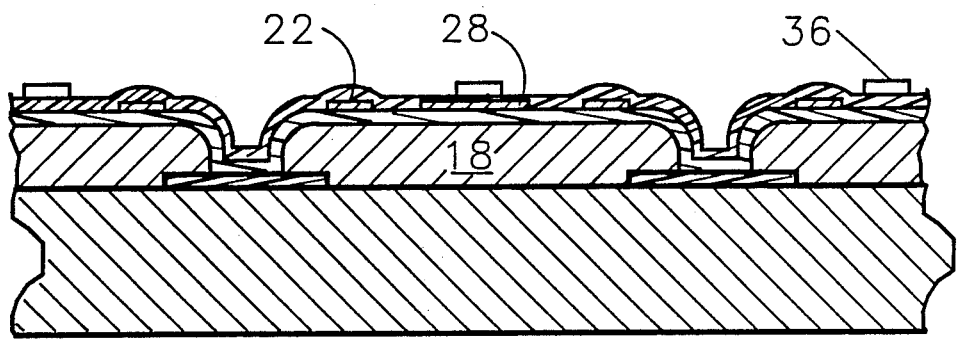
Figure 7:
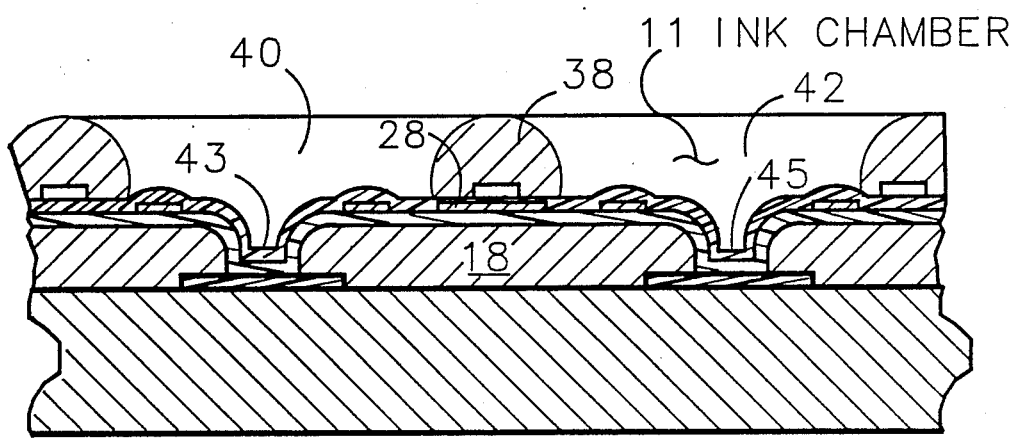

Referring now to FIG. 6, a suitable seed strip or pad 36 such as titanium, chromium, or nickel is formed on the barrier layer 30 and photo defined by masking and etching in a well known manner. This seed material 36 is used to initiate the formation, by way of electrolytic deposition and/or electroplating, a larger overlying nickel pattern 38 which is grown in the annular dome shaped geometry shown in FIG. 7. The nickel 38 is formed in the shape of partially open annular regions which define a plurality of ink reservoirs or ink chamber areas 40 and 42. These ink chambers 40 and 42 are indicated in FIG. 7 and are aligned with the previously formed openings 16 in the nickel orifice plate 18.

Figure 8:
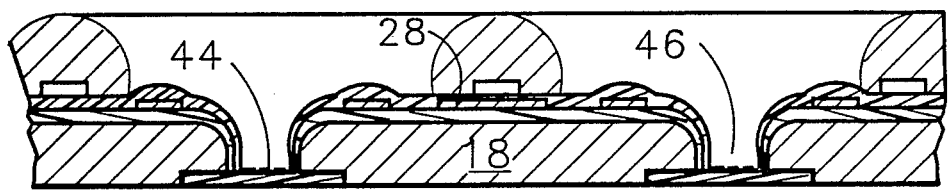

The orifice plate 18, along with its adjacent layers of insulating and conducting films can now be separated from the substrate 10 by peeling it off from the same. The substrate 10 basically performs the function of a temporary support substrate for the orifice plate 18 during the process of fabrication and definition of the various thin film layers. This substrate 10 can be used over and over again in the above described process. In the above process of peeling off the orifice plate 18 from the substrate 10, the areas 43 and 45 of the multiple insulating layers on top of the photoresist pads are pulled away from the orifice plate in FIG. 7 along with the photoresist pads 12, thereby leaving openings 44 and 46 in the orifice plate structure shown in FIG. 8. The openings 44 and 46 thus formed will therefore be initially left here with the ragged edges shown in FIG. 8, but these edges 44 and 46 may be subsequently cleaned off and smoothed out by a mechanical operation such as the use of a light sandblasting with fine grit or plasma erosion.

Figure 9A:
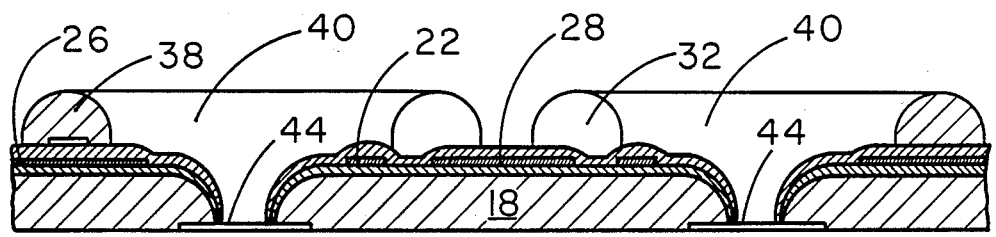
FIGS. 9A and 9B illustrate in cross-section and plan views, respectively, the relative positioning of the lead-in conductors with respect to the C-shaped geometry of the previously formed ink reservoir walls which define facing ink flow ports at the A—A centerline for passing ink into the each of the C-shaped reservoirs.
Figure 9B:
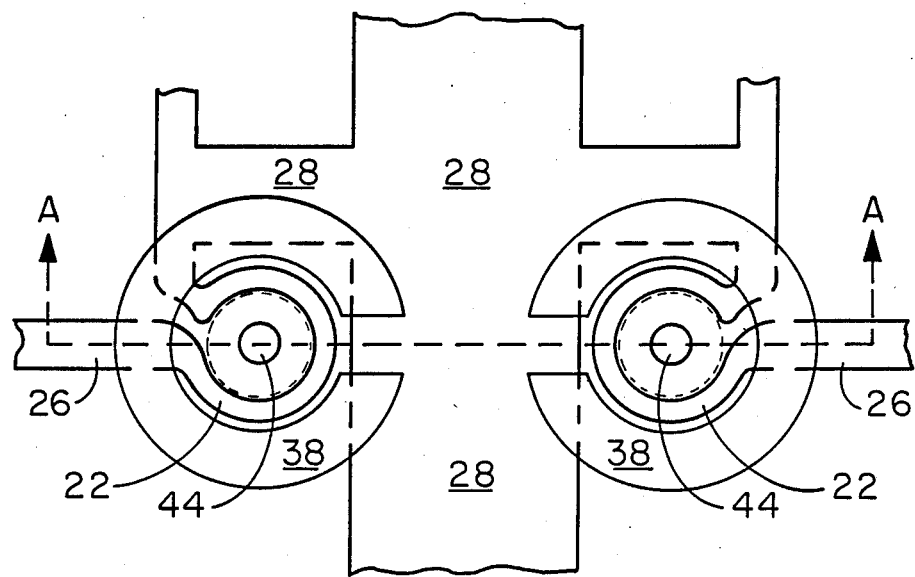

FIG. 9B is a plan view of a preferred embodiment of the invention and shown rotated ninety (90) degrees with respect to the plan views of FIGS. 4B and 5B, and FIG. 9A is a cross section view taken along lines A—A of FIG. 9B. The annular shaped domes 38 which serve to define the ink reservoirs or chambers 40 associated with each orifice opening are provided with the ink flow ports 47 and 49. These ports 47 and 49 will typically communicate with a common ink feed path from a remote common ink supply opening (not shown) in a central region of the substrate 18. This common ink supply opening may take the form of an elongated slot which may be defined by known masking and sandblasting procedures. Such ink feed slots and methods for forming same are described respectively, for example, in U.S. Pat. No. 4,680,859 of Samuel A. Johnson entitled "Thermal Ink Jet Printhead and Method of Manufacture" and in U.S. patent application Ser. No. 052,630 of James Pollacek et al entitled "Precision Milling of Materials", both of which are assigned to the present assignee and incorporated herein by reference.

Next, the structure of FIG. 9 may be secured to a larger ink supply chamber 48 as shown in FIG. 10 using known soldering processes to permanently join the outside wall of the chamber 48 to the metal domes 38. The larger chamber 48 is operative to feed ink in the direction of the arrows 50 and to individual ones of the ink chambers 40 and 42 in the integrated thermal ink jet printhead in FIG. 9. Electrical connection means 51, 52 may be mounted on the outer surface of the large ink reservoir 48 to provide pulse drive circuitry for the printhead of FIG. 9. For example, an insulating substrate 51 will typically carry electrical leads 52 thereon (or therein), and in actual practice may take the form of a flexible (FLEX) circuit or a tape automated bond (TAB) bond circuit of the types well known in the art. The individual electrical leads 52 in such circuits may be connected into the printhead conductors 24,26,28 using known wire or beam lead bonding techniques (not shown), and one such suitable single point TAB bonding process is disclosed, for example, in U.S. Pat. No. 4,635,073 issued to Gary E. Hanson, assigned to the present assignee and incorporated herein by reference.

The following table of values indicates suitable layer deposition processes, layer thicknesses, and materials which may be used in printhead manufacture in accordance with the presently known best mode for carrying out the present invention. However, it should be understood that this table is given by way of example only, add it is not intended to indicate any single absolute best process for manufacturing our printhead, since one single set of preferred process steps and related details have not been selected as of the present-time.

TABLE

| LAYER | SUITABLE MATERIAL | DEPOSITION PROCESS | THICKNESS (MICRONS) |
|---|---|---|---|
| Substrate (10) | Oxidized Silicon Glass | | 200–300 |
| Orifice Plate (18) | Nickel | Plating | 20–75 |
| Insulating Layer (20) | Silicon Dioxide Silicon Nitride Silicon Oxynitride | PECVD * LPCVD ** | 1 to 3 |
| Resistor/ Conductor (22) | Polysilicon Tantalum Silicide Gold | Sputtering PECVD LPCVD | 0.05 to 0.5 |
| Passivation Layer (30) | Silicon Dioxide Silicon Nitride Silicon Oxynitride Silicon Carbide | PECVD LPCVD | 0.5 to 2 |
| Seed Layer (36) | Nickel, Titanium Chromium | Sputtering | 0.5 to 2 |
| Barrier (38) | Nickel | Plating | 10 to 75 |

*Plasma Enhanced Chemical Vapor Deposition
**Low Pressure Chemical Vapor Deposition In the above table, PECVD signifies plasma enhanced chemical vapor deposition, whereas LPCVD signifies low pressure chemical vapor deposition. These processes are generally well known in the thin film art and are therefore not described in further detail herein. However, for a further discussion of these or related thin film technologies, reference may be made to the following three books on thin film technology:

(1) Berry, Hall and Harris, *Thin Film Technology*, Van Nostrand Reinhold Co., New York, 1968.

(2) Maissel and Glang, *Handbook of Thin Film Technology*, NcGraw Hill Book Co, New York, 1970.

(3) Vossen and Kern, *Thin Film Processes*, Academic Press, New York, 1978.

Thus, there has been described a thermal ink jet printhead which is fabricated in its entirety on one supporting dummy substrate which may be reusable many times, thereby reducing the manufacturing cost of the ink jet printhead. The masking steps used in the manufacture of the ink jet printhead described herein comes to a total of four (4) as compared to six (6) steps using the previously known processes for separately forming a thin film resistor substrate and a matching metal orifice plate, respectively. In the prior art processes, the orifice plate and the heater resistors are fabricated on different substrates and thus have to be precisely aligned with each other, resulting in a time consuming and difficult operation. However, in accordance with the present invention, all of the critical parts of the ink jet printhead which require precise alignment, namely the orifice plate, the ink jet chambers and the heater resistors are all formed on the same substrate, thereby providing a novel self-aligning process. The precise alignment of the above three (3) critical parts result in a precisioned thin film structure capable of improved performance in terms of printhead life and ink drop trajectory. After the ink drops are ejected from the orifices of the above-described printhead, the collapsing ink meniscus at the orifice travels toward the ink supply chamber instead of directly at the heater resistor. In this manner, the heater resistors are not subject to direct cavitational forces during an ink jet printing operation, and thus the life of the ink jet printhead is substantially enhanced.

We claim:

1. A self-aligning process for manufacturing a thermal ink jet printhead including the steps of:
    a. providing a reusable substrate;
    b. forming an orifice plate on said substrate;
    c. forming a first barrier layer on said orifice plate;
    d. forming heater resistors on said first barrier layer in a predefined configuration and spacing relative to openings in said orifice plate;
    e. forming a second barrier layer on said first barrier layer and extending over said heater resistors to protect said heater resistors from ink corrosion and cavitation wear;
    f. forming an ink reservoir-defining layer on said second barrier layer and having a plurality of ink reservoir openings aligned with openings in said orifice plate;
    g. providing passages through said first and second barrier layers and extending from said reservoirs and to openings in said orifice plate, whereby said ink reservoir layer may be secured to an ink supply chamber for supplying ink to said plurality of ink reservoirs; and
    h. removing said reusable substrate from said orifice plate.

2. The process defined in claim 1 which further includes affixing an ink supply chamber to said reservoir-defining layer for providing ink to each of said reservoirs from a common source of ink supply.

3. The process defined in claim 1 which includes forming heater resistors integral with lead-in conductors on the surface of said first barrier layer and controlling the resistor/conductor resistance by controlling the cross-section areas of the resistor/conductor material.

4. The process defined in claim 2 which includes forming heater resistors integral with lead-in conductors on the surface of said first barrier layer and controlling the resistor/conductor resistance by controlling the cross-section areas of the resistor/conductor material.

5. A process for manufacturing an ink jet pen which includes:
    a. forming a thin film transducer structure on a reusable substrate and including conductors leading into heat generating transducers;
    b. forming ink-reservoir defining walls adjacent to said transducers;
    c. removing said substrate;
    d. bonding said walls to an ink supply container; and
    e. electrically connecting said conductors to mating leads on said container for providing current to said transducers.

6. The process defined in claim 5 wherein said ink reservoir defining walls are formed in a pattern on said thin film transducer structure and subsequently bonded to said ink supply container.

7. The process defined in claim 6 wherein selective electro-deposition is used to form a plurality of orifice openings in said thin film transducer structure.

8. The process defined in claim 5 wherein said transducers are heat generating transducers and are formed by depositing a plurality of resistors in partially encircling geometry in said thin film transducer structure and integrally joined with a plurality of lead-in conductors.

9. The process defined in claim 8 wherein said walls are formed to partially surround said resistors and provide ink flow thereto.

10. An integrated thermal ink jet printhead comprising:
   a. an orifice plate having plurality of openings therein;
   b. a first barrier layer disposed on said orifice plate;
   c. a plurality of heater resistors arranged in a predefined configuration on said first barrier layer and positioned adjacent said openings in said orifice plate;
   d. a second barrier layer disposed on said first barrier layer and covering said heater resistors and protecting same from ink corrosion and cavitation wear;
   e. an ink reservoir-defining layer disposed on said second barrier layer and having a plurality of ink reservoirs therein aligned with said openings in said orifice plate; and
   f. said first and second barrier layers having a passageway extending therethrough at each opening in said orifice plate for providing an ink flow path from said reservoirs in said reservoir-defining layer and through openings in said orifice plate, whereby said ink reservoir defining layer may be secured to an ink supply chamber or housing for supplying ink to said reservoirs and through said openings in said orifice plate during an ink jet printing operation.

11. The structure defined in claim 10 which further includes an ink supply chamber affixed to said ink reservoir-defining layer for supplying ink from a common source of ink supply to each of said reservoirs.

12. The structure defined in claim 10 wherein said heater resistors are formed integral with lead-in conductors, the resistance of which is controlled in accordance with their established cross sectional area.

13. The structure defined in claim 11 wherein said heater resistors are formed integral with lead-in conductors, the resistance of which is controlled in accordance with their established cross sectional area.

14. An ink jet pen including in combination:
   a. a thin film transducer structure having conductors thereon leading into heat generating transducers and further having ink ejection orifices associated with said transducers;
   b. annular walls adjacent said transducers and defining ink reservoirs therefor;
   c. an ink container bonded to said annular walls; and
   d. means on said container for providing an external electrical connection to said conductors on said thin film transducer structure.

15. The pen defined in claim 14 wherein said walls are formed to have ink flow ports therein for supplying ink to said transducers.

16. The pen defined in claim 14 wherein said transducers are heater resistors which partially surround said orifices in said thin film transducer structure.

17. The pen defined in claim 16 wherein said walls are formed to have ink flow ports therein for supplying ink to said heater resistors and which partially surround said heater resistors.

18. The pen defined in claim 17 wherein said heater resistors are integrally joined to said conductors.

19. The pen defined in claim 14 wherein said transducers are heater resistors which partially encircle said orifices and which are integrally joined to said conductors.

* * * * *